(12) United States Patent
Gieseler et al.

(10) Patent No.: US 7,884,501 B2
(45) Date of Patent: Feb. 8, 2011

(54) METHOD FOR AUTOMATIC OPERATING VOLTAGE DETECTION

(75) Inventors: Michael Gieseler, Dresden (DE); Manfred Sorst, Radebeul (DE)

(73) Assignee: Zentrum Mikroelektronik Dresden AG, Dresden (DE)

( * ) Notice: Subject to any disclaimer, the term of this patent is extended or adjusted under 35 U.S.C. 154(b) by 167 days.

(21) Appl. No.: 12/281,343

(22) PCT Filed: Mar. 2, 2007

(86) PCT No.: PCT/EP2007/051995
§ 371 (c)(1),
(2), (4) Date: Nov. 6, 2008

(87) PCT Pub. No.: WO2007/099163
PCT Pub. Date: Sep. 7, 2007

(65) Prior Publication Data
US 2009/0160257 A1    Jun. 25, 2009

(30) Foreign Application Priority Data
Mar. 2, 2006    (DE) ................ 10 2006 010 252

(51) Int. Cl.
*H02J 1/10* (2006.01)
(52) U.S. Cl. ......................................... 307/58
(58) Field of Classification Search ............... 307/58
See application file for complete search history.

(56) References Cited
U.S. PATENT DOCUMENTS

| | | | |
|---|---|---|---|
| 5,510,735 A | 4/1996 | Mahabadi | |
| 5,528,548 A | 6/1996 | Horiguchi et al. | |
| 7,579,713 B2 * | 8/2009 | Uguen et al. | ............ 307/58 |
| 2005/0280447 A1 | 12/2005 | Curtis et al. | |

FOREIGN PATENT DOCUMENTS

| | | |
|---|---|---|
| DE | 19737777 A1 | 7/1998 |
| EP | 0843398 A | 5/1998 |
| JP | 2000124780 A | 4/2000 |

OTHER PUBLICATIONS

The International Search Report for PCT/EP2007/051995, filed May 25, 2007.

* cited by examiner

*Primary Examiner*—Robert L. DeBeradinis
(74) *Attorney, Agent, or Firm*—Heslin Rothenberg Farley & Mesiti P.C.

(57) ABSTRACT

A method for automatic operating voltage detection, in which one internal supply voltage (vdd) is selected from at least two different external supply voltages, with a first external voltage supply (VDDA) being applied permanently, is based on the object of reducing the circuit complexity for automatic operating voltage detection, the operating current caused by the selection arrangement and the required chip area, in which case the voltage ratios between the two different external supply voltages can be as required. This object is achieved in that a reference voltage (Vref) and a voltage (VDDreg) is produced from the first external supply voltage (VDDA), the reference voltage (Vref) is compared with a second external supply voltage (VDDIO), and either the voltage (VDDreg) produced from the first external supply voltage (VDDA) or the second external supply voltage (VDDIO) is released as an internal supply voltage (vdd), depending on the comparison.

3 Claims, 3 Drawing Sheets

METHOD FOR AUTOMATIC OPERATING VOLTAGE DETECTION

CROSS REFERENCE TO RELATED APPLICATIONS

Figure 1:
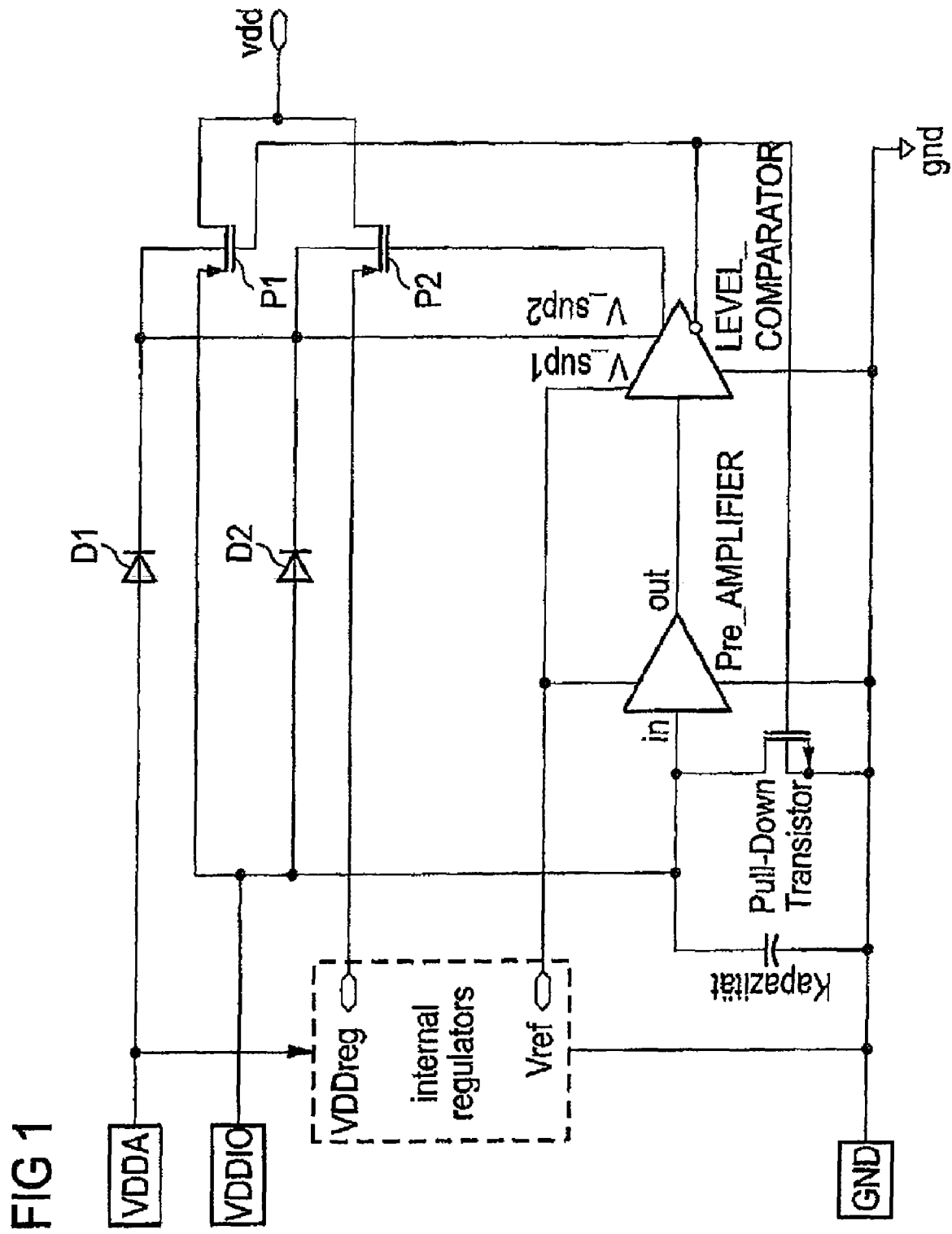

This application is a national stage filing under section 371 of International Application No. PCT/EP07/51995, filed on Mar. 2, 2007, and published in German on Sep. 7, 2007, as WO 2007/099163 A1, and which claims priority of German application No. 10 2006 010 252.5, filed on Mar. 2, 2006, the entire disclosure of these applications being hereby incorporated herein by reference.

BACKGROUND ART

The invention concerns a method and arrangement for automatic detection of operating voltage, in which a selection of an internal power supply voltage occurs from at least two different external power supply voltages, a first external power supply voltage being permanently applied.

For example, methods and arrangements for automatic detection of operating voltage are known from GB 2 402 004, US 2004/0222840, JP 2004234540 and EP 1 163 571.

The drawbacks of these methods and arrangements consist of the fact that either a microprocessor is required for control or an analog circuit part is used, which leads to an increase in current demand by the overall arrangement. Another drawback is that the two different external power supply voltages must be in a specific ratio to each other.

The task of the invention therefore consists of reducing the circuit cost for automatic detection of operating voltage, the operating current caused by the selection arrangement and the required chip surface, in which the voltage ratios of the two different power supply voltages can be arbitrary relative to each other.

The solution to the task according to the invention on the method side is implemented by the features of Claim 1.

BRIEF SUMMARY OF THE INVENTION

Supply of internal voltage vdd occurs via two alternately opened pMOS transistors, P1 or P2, corresponding to the prior art, in which it is ensured, because of the secondary condition, that the potential trough of P1 and P2 is supplied with the highest externally applied operating voltage.

This occurs by supplying the bulk potential of control transistors P1 and P2 by means of diodes D1 and D2, which are expediently implemented as pMOS active areas within the common trough of P1 and P2. In order to guarantee reliable blocking of the active areas (especially the source areas) of P1 and P2, the diode surfaces of D1 and D2 should be much larger than the source areas of P1 and P2.

In order to create a fully integrated circuit without noticeable power loss and with the smallest possible surface requirement, during implementation value is placed on a preferably digital implementation of the control elements, so that only CMOS leakage currents flow in the static case.

A CMOS-Schmitt trigger is used as preamplifier with small hysteresis, so that an oscillating tendency of the recognition circuit is ruled out.

Because of the always present supply (auxiliary) voltage vref, a constant point for the evaluation threshold is ensured; this applies both for the Schmitt trigger and the subsequent level comparator.

The level comparator consists essentially of an RS-flip-flop, whose state can be changed exclusively by nMOS transistors, which means that the threshold value is independent of the operating conditions in terms of voltage; the nMOS threshold voltage therefore plays a central role for the threshold value. The RS-flip-flop furnishes the alternative control potentials for the gates of the pMOS transistors P1 and P2, in which, by supplying the flip-flop from the potential trough of the pMOS transistors, their alternate reliable blocking is always guaranteed.

The Schmitt trigger is provided on the input side with a switchable pull-down transistor, which ensures a distinct input reference LOW in the unwired VDDIO. For a case in which a higher input voltage lies on the VDDIO than the threshold value, the pull-down transistor is deactivated by means of the negating output of the RS-flip-flop to avoid a cross current after this state of the circuit is recognized.

The capacitance serves to avoid oscillations during the rise in oscillating voltage of one of the two or both input voltages VDDA and VDDIO, and this, in conjunction with the Schmitt trigger, even with arbitrarily slow rate of rise. For the capacitance value, it is found from calculations that it lies far below the parasitic capacitance that is present anyway, because of the bond island and, under practical conditions, can optionally be omitted as a separate device.

Figure 2:
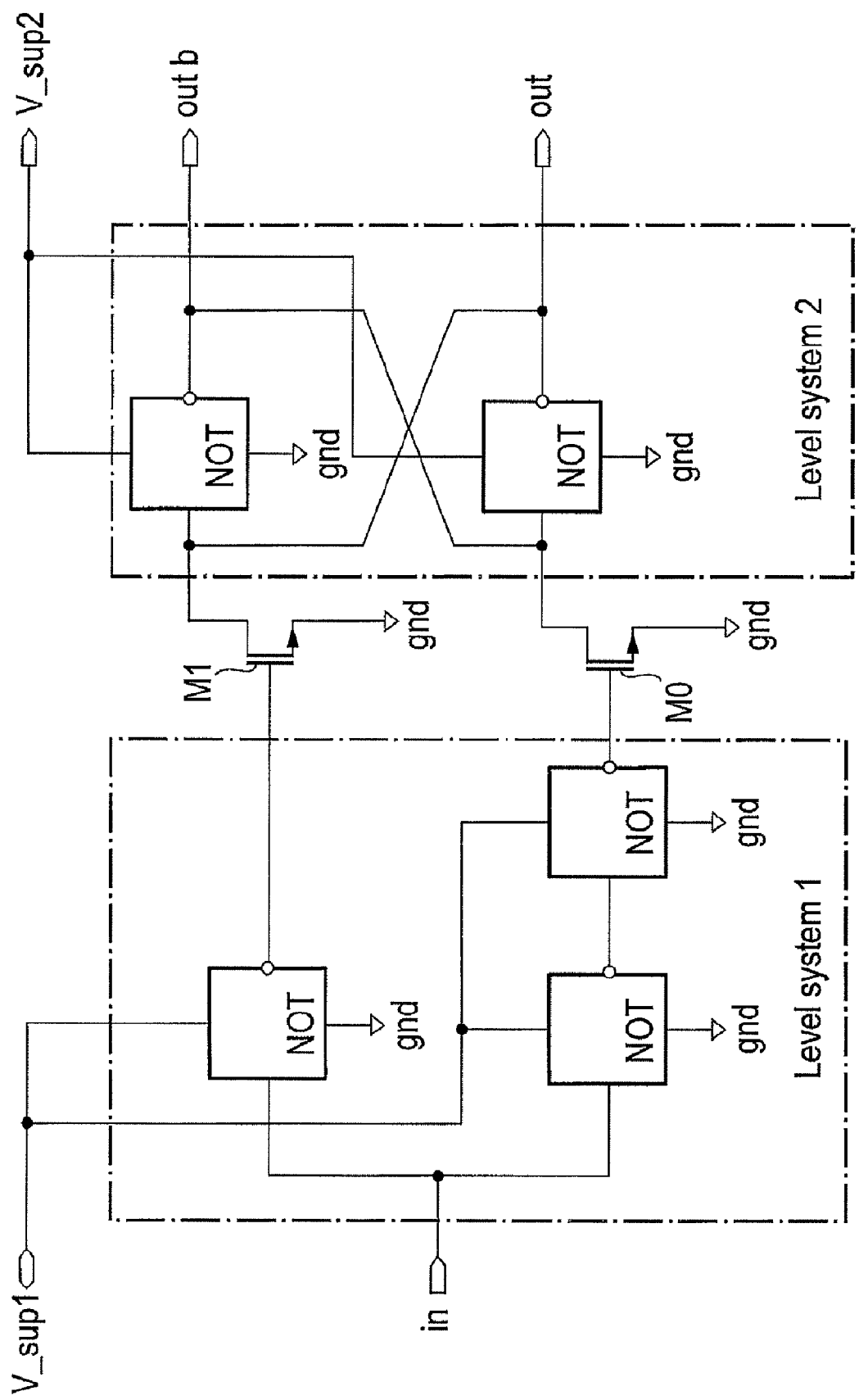
Figure 3:
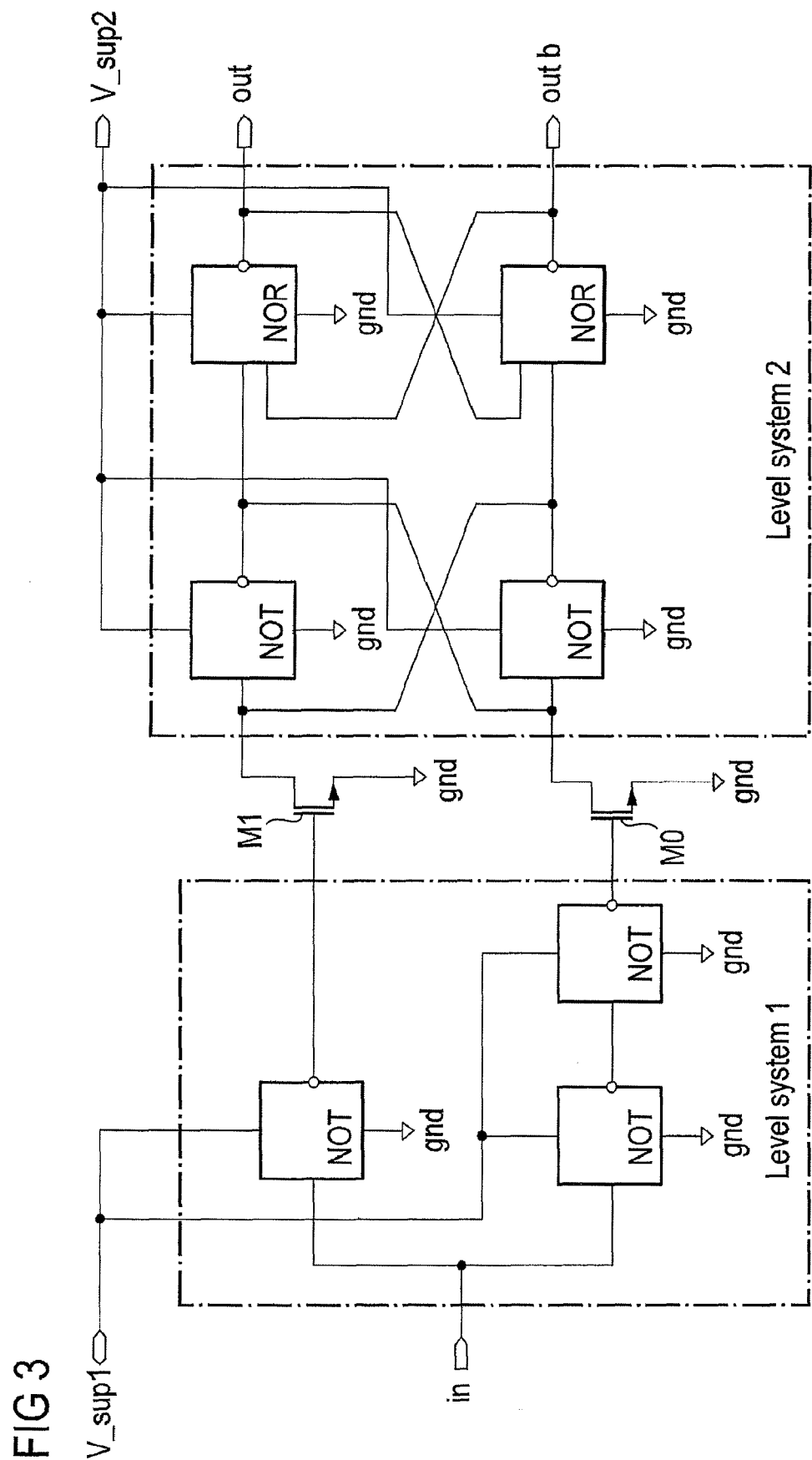

The solution to the task according to the invention on the arrangement side is implemented by the features of FIGS. 1 to 3.

BRIEF DESCRIPTION OF THE DRAWING FIGURES

The invention will be further explained by means of two practical examples. In the examples:

FIG. 1 shows a circuit arrangement according to the invention for implementation of the method, FIG. 2 shows a simple variant of the RS-flip-flop of the level comparator with nMOS selection and reset transistors (M0 and M1), as well as separate power supply (Vsup_1 and Vsup_2) to implement the "true" split power supply, and FIG. 3 shows a variant with identical switching time with reference to the output of the RS-flip-flop with nMOS selection and reset transistors (M0 and M1), as well as separate power supply (Vsup_1 and Vsup_2) to implement the "true" split power supply.

DETAILED DESCRIPTION

"True" split power supply is understood to mean that two power supply voltages, independent of each other (for example, VDDA and VDDIO), may assume arbitrary values relative to each other in the context of defined operating conditions. Consequently, there is no requirement that one of the two voltages always be greater.

The task of the solution according to the invention consists of providing an internal power supply voltage vdd either from a voltage VDDreg, derived from the permanently present external voltage VDDA or from an externally present voltage VDDIO,
in which an external power supply voltage VDDIO can be present
either with a value greater than a threshold value
or the pin for feed of the external voltage VDDIO can be bonded to ground GND or the pin VDDIO is unwired.

In the first case, the external voltage VDDIO is conveyed to vdd and, in the two latter cases, the internal voltage is obtained from VDDreg and therefore indirectly from VDDA.

For the case, in which an external voltage VDDIO (greater than the threshold value) is used, it should be irrelevant in which relation the two external power supply voltages VDDA and VDDIO are to each other.

As auxiliary voltage, a voltage vref, also derived from VDDA, is used.

Comment Concerning FIG. 2:

In the context of admissible operating conditions caused by the technology, both power supply voltages Vsup_1 and Vsup_2 of the level converter can be in an arbitrary relation to each other without a cross current flowing in the stationary state.

Comment Concerning FIG. 3:

Because of the design of the "level converter flip-flop" with identical switching time, a time-minimal transfer of input voltages is achieved, i.e., the cross current during the decision by P1 and P2 is also minimized to the shortest possible period.

The invention claimed is:

1. Method for automatic detection of operating voltage, in which a selection of an internal power supply voltage occurs from at least two different external power supply voltages, and a first external power supply voltage is permanently present, comprising the steps of: internally generating a reference voltage Vref and a voltage VDDreg from the first external power supply voltage VDDA, comparing the reference voltage Vref and a second external power supply voltage VDDIO, continuously releasing the voltage VDDreg internally generated from the first external power supply voltage VDDA as the internal power supply voltage except when the second external supply voltage VDDDIO is higher than the reference voltage Vref, and releasing the second external power supply voltage VDDIO as the internal power supply voltage when the second external power supply voltage VDDIO is higher than the reference voltage Vref.

2. Method according to claim 1, wherein the second external power supply voltage VDDIO has a value greater than the reference voltage Vref.

3. Method according to claim 1, wherein the second external power supply voltage VDDIO has a value smaller than the reference voltage Vref.

* * * * *